United States Patent
D'Amore et al.

(10) Patent No.: US 12,068,731 B2
(45) Date of Patent: Aug. 20, 2024

(54) AMPLIFIER POWER ATTENUATOR AND CLOSED LOOP OPERATION

(71) Applicant: D'Amore Engineering, LLC, Camarillo, CA (US)

(72) Inventors: Anthony T. D'Amore, Camarillo, CA (US); Juan Rodriguez, Mesa, AZ (US)

(73) Assignee: D'Amore Engineering, LLC, Gilbert, AZ (US)

( * ) Notice: Subject to any disclaimer, the term of this patent is extended or adjusted under 35 U.S.C. 154(b) by 204 days.

(21) Appl. No.: 17/884,697

(22) Filed: Aug. 10, 2022

(65) Prior Publication Data

US 2024/0056045 A1 Feb. 15, 2024

(51) Int. Cl.
*H03F 3/183* (2006.01)
*G06F 3/16* (2006.01)
*H03G 3/30* (2006.01)
*H04R 3/02* (2006.01)

(52) U.S. Cl.
CPC ........... *H03G 3/3005* (2013.01); *G06F 3/162* (2013.01); *H03F 3/183* (2013.01); *H04R 3/02* (2013.01); *H03F 2200/03* (2013.01); *H03G 2201/106* (2013.01)

(58) Field of Classification Search
CPC .. H03G 3/30; H04R 3/102; G06F 3/16; H03F 3/183
USPC ...................................................... 381/93, 59
See application file for complete search history.

(56) References Cited

U.S. PATENT DOCUMENTS

| | | | |
|---|---|---|---|
| 4,301,330 A | 11/1981 | Trump | |
| 4,330,686 A | 5/1982 | Roe | |
| 5,119,412 A * | 6/1992 | Attallah | H04M 11/007 379/102.07 |
| 5,479,090 A * | 12/1995 | Schultz | H02M 3/156 323/284 |
| 6,201,680 B1 | 3/2001 | Tokatian | |
| 6,275,018 B1 * | 8/2001 | Telefus | H02M 3/156 363/16 |
| 7,579,958 B2 | 8/2009 | Wallace | |
| 8,873,211 B1 * | 10/2014 | Butler | H03K 17/795 361/87 |
| 9,693,138 B2 | 6/2017 | Fraisse | |
| 10,021,482 B2 | 7/2018 | Fraisse | |
| 2004/0175002 A1 * | 9/2004 | Christensen | H04R 29/007 381/59 |

(Continued)

*Primary Examiner* — William J Deane, Jr.
(74) *Attorney, Agent, or Firm* — Neustel Law Offices

(57) ABSTRACT

An amplifier power attenuator utilizes an amplified audio feedback signal from an audio amplifier (which is driving a loudspeaker), along with a user-set impedance and a maximum voltage set-point reflective of the operational parameters of the loudspeaker, to attenuate an audio signal prior to amplification thereby preventing damage to the loudspeaker. The impedance of a variable impedance optocoupler is changed to adjust the attenuation of the audio signal to one of a plurality of predetermined attenuation levels responsive to an error between a voltage level of the feedback signal and the maximum voltage set-point. The error is reflected in a counter value having a linear or non-linear relationship with the error dependent upon a magnitude of the error; the counter value is assessed against a plurality of target values associated with respective ones of the predetermined attenuation levels to identify the attenuation to be applied to the audio signal.

20 Claims, 4 Drawing Sheets

(56) References Cited

U.S. PATENT DOCUMENTS

| | | | |
|---|---|---|---|
| 2009/0206657 A1* | 8/2009 | Vuk | H02J 7/345 |
| | | | 307/9.1 |
| 2017/0238380 A1* | 8/2017 | Bannister | H05B 45/395 |
| | | | 315/224 |
| 2019/0214947 A1* | 7/2019 | Baretich | H03F 3/183 |

* cited by examiner

AMPLIFIER POWER ATTENUATOR AND CLOSED LOOP OPERATION

CROSS REFERENCE TO RELATED APPLICATIONS

Not applicable to this application.

STATEMENT REGARDING FEDERALLY SPONSORED RESEARCH OR DEVELOPMENT

Not applicable to this application.

BACKGROUND

The described example embodiments in general relate to attenuators and, more specifically, to an amplifier power attenuator that attenuates an audio signal prior to its supply to an audio amplifier to prevent damage to, and/or sound distortion at, a loudspeaker that is being driven by the audio amplifier.

In a typical audio system set-up, as illustrated in FIG. 1, an audio source produces a low power analog (or digital) signal that is supplied directly to an audio amplifier with the audio amplifier operating to produce an analog, higher power version of the same signal; the higher power signal is supplied directly to a loudspeaker where it is used by one or more drivers (e.g., woofers, tweeters, midrange) to generate sound.

Traditionally, the audio amplifier has no feedback system in place from which to monitor power output levels. As such, it is possible for the user to increase the volume level of the audio system or the gain of the audio amplifier to the point of overpowering the loudspeaker thus causing speaker damage and/or harsh-sounding clipping distortion, which is of particular concern with respect to tweeters. In some instances, a fuse or positive thermal coefficient ("PTC") device (e.g., lightbulb) is placed in series with the loudspeaker to limit power and protect the speaker, however, this does not solve the harsh-sounding amplifier clipping distortion problem and the PTC devices also tend to fail when overpowered.

SUMMARY

Some of the various embodiments of the present disclosure relate to an amplifier power attenuator and its operation within a closed loop audio system that includes an audio source, audio amplifier, and loudspeaker. Within the closed loop audio system, the amplifier power attenuator operates to prevent damage to the loudspeaker or other audio equipment and/or to prevent sound distortion at the loudspeaker by attenuating an audio signal from the audio source prior to supplying the audio signal to the audio amplifier.

The amplifier power attenuator utilizes an amplified audio feedback signal from the audio amplifier (which is the same signal driving the loudspeaker), along with a user-set impedance and a user-set maximum power set-point reflective of the operational parameters of the loudspeaker, to attenuate an audio signal from the audio source prior to amplification. The impedance of a variable impedance optocoupler is changed to adjust the attenuation of the audio signal to one of a plurality of predetermined attenuation levels responsive to an error between a voltage level of the amplified audio feedback signal and the a maximum power set-point determined from the user-set impedance and the user-set maximum power set-point. The error is reflected in a counter value having a linear or non-linear relationship with the error dependent upon the magnitude of the error. The counter value is assessed against a plurality of target values associated with respective ones of the predetermined attenuation levels to identify the attenuation to be applied to the audio signal.

There has thus been outlined, rather broadly, some of the embodiments of the present disclosure in order that the detailed description thereof may be better understood, and in order that the present contribution to the art may be better appreciated. There are additional embodiments that will be described hereinafter and that will form the subject matter of the claims appended hereto. In this respect, before explaining at least one embodiment in detail, it is to be understood that the various embodiments are not limited in its application to the details of construction or to the arrangements of the components set forth in the following description or illustrated in the drawings. Also, it is to be understood that the phraseology and terminology employed herein are for the purpose of the description and should not be regarded as limiting.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evidence to the contrary from the description, where elements in different figures use identical reference numbers, the elements are generally either identical or at least similar in function or purpose.

DETAILED DESCRIPTION

Figure 1:
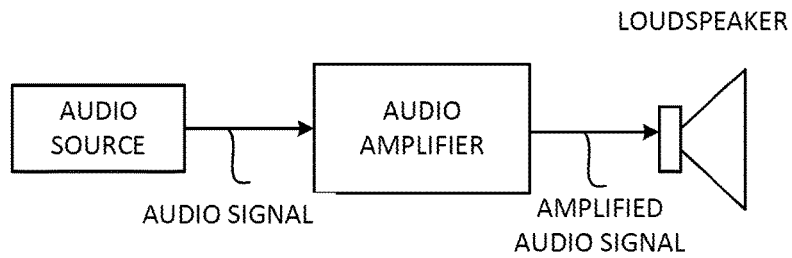
FIG. 1 is a block diagram of a typical prior art audio system.
Figure 2:
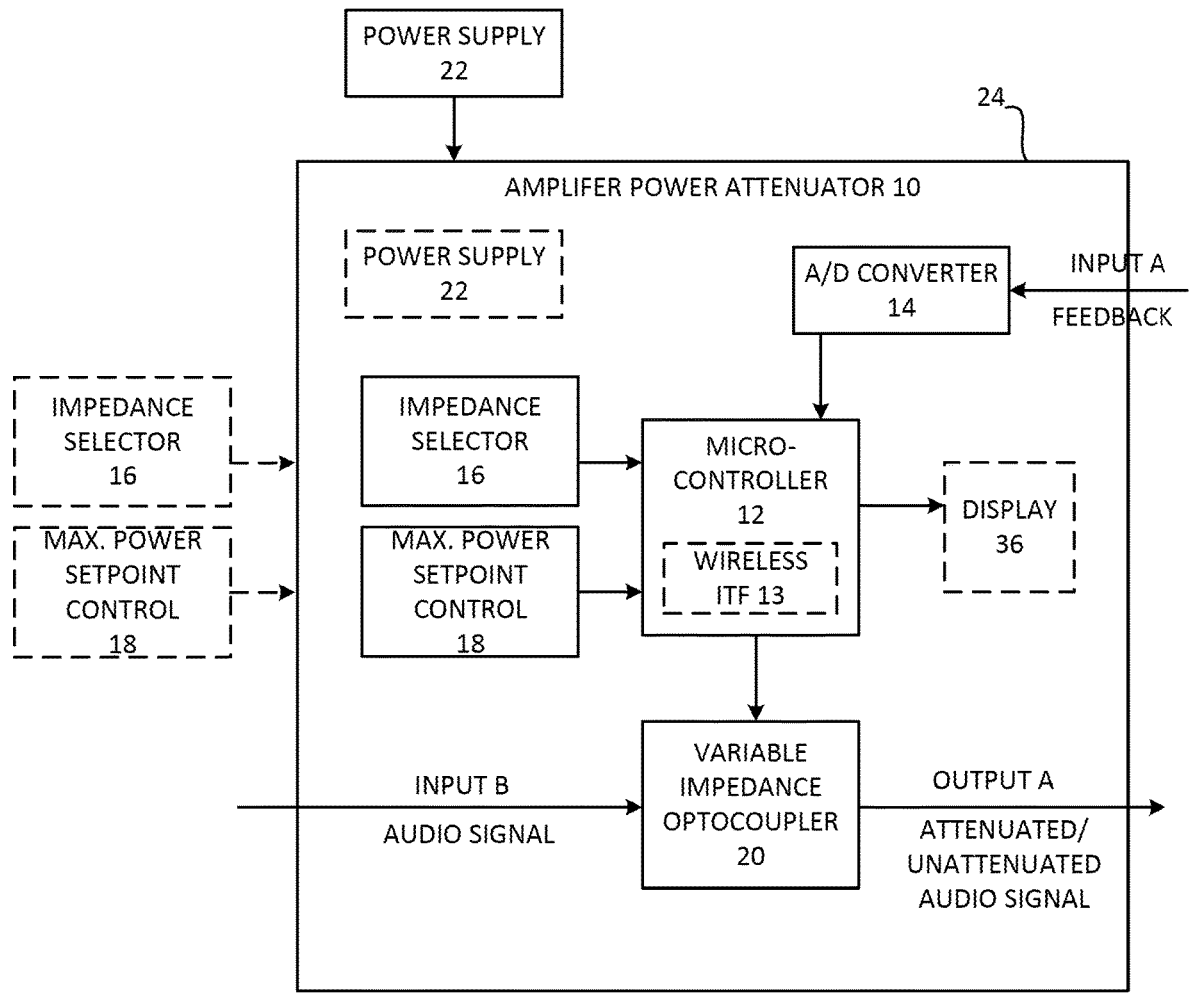
FIG. 2 is a block diagram of an amplifier power attenuator according to the present disclosure.

A. Overview.

Some of the various embodiments of the present disclosure relate to an amplifier power attenuator that produces an attenuated audio signal. Some of the various embodiments of the present disclosure relate to a closed-loop method for attenuating an audio signal supplied to an audio amplifier that drives a loudspeaker in order to protect the loudspeaker and/or other audio equipment from damage and/or sound distortion.

In certain aspects, referring to FIGS. 2-6, the amplifier power attenuator 10 includes a microcontroller 12, a variable impedance optocoupler 20, an impedance selector 16, and a maximum set-point power control 18. The microcontroller 12 receives an amplified audio feedback signal from an audio amplifier 44 driving a loudspeaker 46. The variable impedance optocoupler 20 is in communication with the microcontroller 12 and receives an audio signal from an audio source 42. The impedance selector 16 is in communication with the microcontroller 12 and is used to define an impedance of the loudspeaker 46. The maximum power set-point control 18 is in communication with the microcontroller 12 and is used to define a maximum power set-point of the loudspeaker 46. The microcontroller 12 controls the variable impedance optocoupler 20 to attenuate the audio signal and output the attenuated audio signal to the audio amplifier 44. The attenuation of the audio signal is based on the amplified audio feedback signal, the impedance, and the maximum power set-point.

In certain aspects, the impedance and the maximum power set-point are user-set values. In certain aspects, the amplifier power attenuator 10 includes an independent structural housing 24 within which at least the microcontroller 12 and the variable impedance optocoupler 20 are housed. In certain aspects, the independent structural housing 24 includes an audio input interface 26 through which the audio signal is supplied to the microcontroller 12, an amplified audio input interface 28 through which the amplified audio signal is supplied to the microcontroller 12, and an attenuated audio signal output interface 32 through which the amplified audio signal is output from the microcontroller 12. In certain aspects, the amplifier power attenuator 10 includes a display in communication with the microcontroller 12. In certain aspects, the amplifier power attenuator 10 includes a low power, power supply 22 powering the microcontroller 12 that is internal (or external) to the independent structural housing 24.

In certain aspects, the amplifier power attenuator 10 includes a wireless communication interface 13. Further, at least one of the impedance selector 16 and the maximum power set-point control 18 are external to the independent structural housing 24 and wirelessly communicates the respective impedance or maximum power set-point to the microcontroller 12 through the wireless communication interface 13.

In certain aspects, the amplifier power attenuator 10 includes an A/D converter 14 that converts the amplified audio feedback signal from an analog signal to a digital signal that is supplied to the microcontroller 12.

In certain aspects, the microcontroller 12 of the amplifier power attenuator 10 controls the variable impedance optocoupler 20 to attenuate the audio signal to one of a plurality of predetermined attenuation levels. In certain aspects, the attenuation of the audio signal to one of the plurality of predetermined attenuation levels is based on an error in the amplified audio feedback signal where the error is representative of a difference between a voltage level of the amplified audio feedback signal and a maximum voltage set-point as determined from the impedance of the loudspeaker 46 and the maximum power set-point. In certain aspects, the error in the amplified audio feedback signal is reflected in a counter value that is compared to a plurality of target values associated with different ones of the predetermined attenuation levels. In certain aspects, a relationship between the error in the amplified audio feedback signal and the counter is either linear or non-linear dependent upon a magnitude of the error.

In certain aspects, a closed-loop method 50, 80 for attenuating an audio signal supplied to an audio amplifier that is driving a loudspeaker includes:

(a) receiving an impedance setting of the loudspeaker 46, S52, S82;

(b) receiving a maximum power set-point of the loudspeaker 46, S54, S84;

(c) determining a maximum voltage set-point based on the impedance setting and the maximum power set-point;

(d) receiving an audio signal input from an audio source 42, S56, S86;

(e) receiving an amplified audio feedback signal representative of an output of the audio amplifier 44, S58, S88;

(f) determining a voltage level of the amplified audio feedback signal, S60, S90;

(g) determining that the voltage level of the amplified audio feedback signal is greater than the maximum voltage set-point, S62, S92, S96, S100;

(h) responsive to determining that the voltage level of the amplified audio feedback signal is greater than the maximum voltage set-point, controlling a variable impedance optocoupler to present a decreased impedance to the audio signal to reduce the voltage level of the audio signal resulting in an attenuated audio signal, S66, S110;

(i) supplying the attenuated audio signal to the audio amplifier S68, S114; and (j) repeating steps (d)-(j).

In certain aspects, controlling the variable impedance optocoupler includes controlling the variable impedance optocoupler to present one of a plurality of predetermined impedances to ground on the audio signal input, wherein each of the plurality of predetermined impedances corresponds to a different one of a plurality of predetermined attenuation levels.

In certain aspects, attenuating the audio signal to one of a plurality of predetermined attenuation levels is based on an error in the amplified audio feedback signal, wherein the error is representative of a difference between a voltage level of the amplified audio feedback signal and the maximum voltage set-point, S92, S96, S100.

In certain aspects, the error in the amplified audio feedback signal is reflected in a counter value, S94, S98, S102, that is compared to a plurality of target values associated with respective predetermined attenuation levels from the plurality of predetermined attenuation levels, S106. In certain aspects, a relationship between the error in the amplified audio feedback signal and the counter is either linear or non-linear dependent upon an amount of the error, S98, S102

B. Microcontroller.

The microcontroller 12 is a processor where the data processing logic and control is included on an integrated circuit. The microcontroller 12 contains arithmetic, logic, and control circuitry, and is capable of interpreting and executing program instructions stored in its memory (e.g., non-transitory memory); the microcontroller 12 is also capable of receiving digital inputs and producing digital outputs. The microcontroller 12 receives inputs from the analog-to-digital converter 14, the impedance selector 16, and the maximum power selector 18. The microcontroller 12 produces an output to control operation of the variable optical power attenuator 20. In certain embodiments, the microcontroller 12 includes a wireless interface 13 enabling the microcontroller 12 to communicate (transmit and/or receive) with a wireless remote programming device (e.g., smartphone, computer, controller, etc.) via one or more wireless communication protocols, e.g., Wi-Fi, Bluetooth, etc.

C. Analog-to-Digital Converter.

The analog-to-digital converter 14 receives an analog signal (continuous quantity) and converts it into a digital signal (discrete time digital representation). The input to the analog-to-digital converter 14, e.g., Input A, is an analog audio signal produced by an audio amplifier (discussed further herein). The output of the analog-to-digital converter 14 is a digital representation of the audio signal and is supplied to the microcontroller 12.

D. Impedance Selector.

The impedance selector 16 is an internal or external user-interfaced control element that enables the user to define an impedance setting within the amplifier power attenuator 10 that reflects a manufacturer-defined impedance of a loudspeaker to which the amplifier power attenuator 10 is to be indirectly coupled via an audio amplifier. In certain embodiments, a user defines an impedance that is different from the manufacturer-defined impedance. Example embodiments of the impedance selector 16 can include, but are not limited to: a button, a potentiometer, DIP switches, a rotary switch or encoder; the output of the impedance selector 16 is supplied as an input to the microcontroller 12. In certain embodiments, the impedance selector 16 comprises a wireless programming device (e.g., smartphone, computer, controller, etc.) through which a user can enter an impedance setting that is transmitted to and stored at the microcontroller 12.

E. Maximum Power Set-Point Control.

The maximum power set-point control 18 is an internal or external user-interfaced control element that enables the user to define, at the amplifier power attenuator 10, a maximum allowable audio amplifier power set-point that reflects a manufacturer-defined maximum power rating of a loudspeaker to which the amplifier power attenuator 10 is to be indirectly coupled via an audio amplifier. In certain embodiments, the user defines a maximum allowable amplifier power set-point that is different from the manufacturer-defined maximum power rating. Example embodiments of the maximum power set-point control 18 can include, but are not limited to: a button, a potentiometer, DIP switches, a rotary switch or encoder. The output of the maximum power set-point control 18 is supplied as an input to the microcontroller 12. In certain embodiments, the maximum power set-point control 18 comprises a wireless programming device (e.g., smartphone, computer, controller, etc.) through which a user can enter a maximum power set-point that is transmitted to and stored at the microcontroller 12.

F. Variable Impedance Optocoupler.

The variable impedance optocoupler 20, acting as a potentiometer, comprises an LED input optically coupled to a photocell wherein the photocell has a variable impedance in the range of a high impedance (e.g., ~500 KOhms) when the LED current is "off" and a low impedance (e.g., ~160 Ohms) when the LED current is "on." An example embodiment of the variable impedance optocoupler is the NSL-32 optocoupler available from Advanced Photonix of Camarillo, CA. The microcontroller 12 controls the current to the LED resulting in a corresponding impedance that is used to attenuate the voltage, Vin of an input audio signal, e.g., Input B of FIG. 2, received from an audio source; the attenuated audio signal output from the variable impedance optocoupler 20, which has a voltage Vout, that is different from Vin, is supplied to an audio amplifier in analog or digital form.

The variable impedance optocoupler 20 includes an inherent delay and decay that operates to control audio signal oscillation without additionally circuitry. In certain embodiments, the microcontroller 12 controls the variable impedance optocoupler 20 to provide one of a plurality of pre-defined attenuation levels (e.g., 2-15 predefined attenuation levels).

G. Power Supply.

The power supply 22 comprises a low voltage power supply having power sufficient to power the electronics of the amplifier power attenuator 10. The power supply may be internal or external to the amplifier power attenuator 10.

H. Housing and Display.

Figure 3:
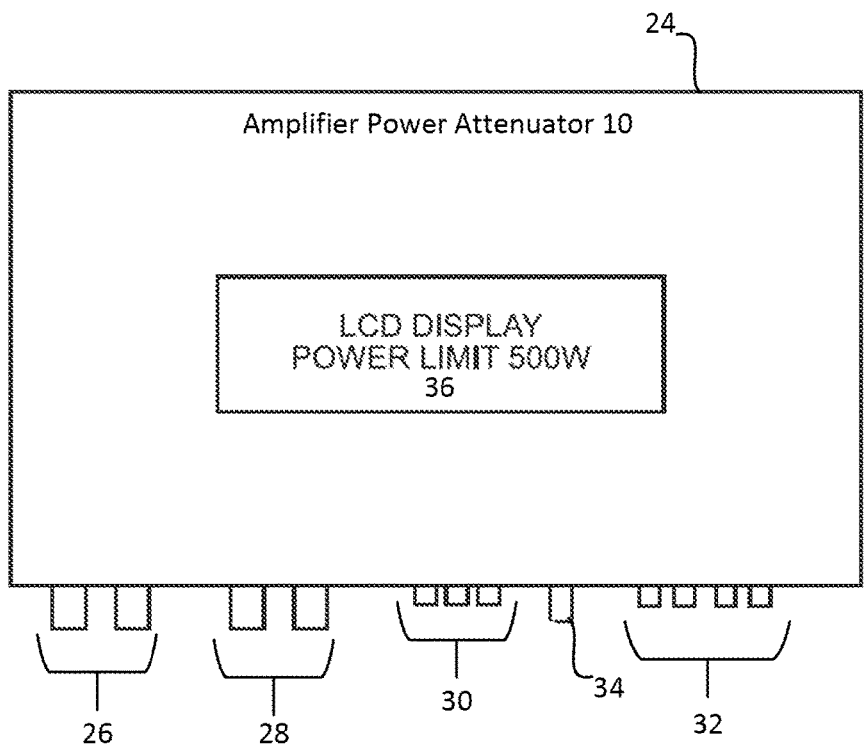
FIG. 3 is an example housing of the amplifier power attenuator.

Referring to FIG. 3, an example configuration of a housing 24 of the amplifier power attenuator 10 is illustrated. As shown, the housing 24 has a box configuration of sufficient size to accommodate the electronics of the amplifier power attenuator 10. The housing 24 generally comprises a box-shaped structure made of one or more suitable materials, e.g., plastics, metals, etc. The housing 24 includes a plurality of interfaces for interfacing with one or more external components.

The input interfaces can include, for example, one or more audio input interfaces 26 (analog and/or digital inputs) through which an audio signal (e.g., Input B of FIG. 2) can be received from an audio source and one or more amplified audio input interfaces 28 (analog and/or digital inputs) through which an amplified audio feedback signal (e.g., Input A of FIG. 2) can be received from an audio amplifier. The interfaces can additionally include a power interface 30 to interface with a low voltage power supply 22 to provide power to the electronics within the housing 24. The output interfaces can include, for example, one or more attenuated audio output interfaces 32 (e.g., Output A of FIG. 2) for outputting an attenuated audio signal that is provided to an audio amplifier.

In certain embodiments, the housing 24 is equipped with one or more user-accessible controls 34 (e.g., dial, switch, button, etc.) with which to set the impedance setting and/or the maximum power set-point that is communicated to the microcontroller 12. In certain embodiments, the housing is equipped with an electronic display 36 (e.g., LCD display, LED/OLED display, etc.) upon which can be displayed one or more of the impedance settings, the maximum power set-point, a currently detected power level, audio level information, and whether attenuation is active. The information displayed can be in a text or graphical form (e.g., bar graph). In certain embodiments, the electronic display 36 includes a touch interface through which a user may enter the impedance setting and/or maximum power set-point that is communicated to the microcontroller 12. In certain embodiments, the housing 24 is equipped with one or more mechanical and/or structural features that enable the housing to be mounted in a motorized vehicle, stacked in a home audio system rack, and/or mounted to a professional audio system rack.

I. Implementation of Amplifier Power Attenuator.

Figure 4:
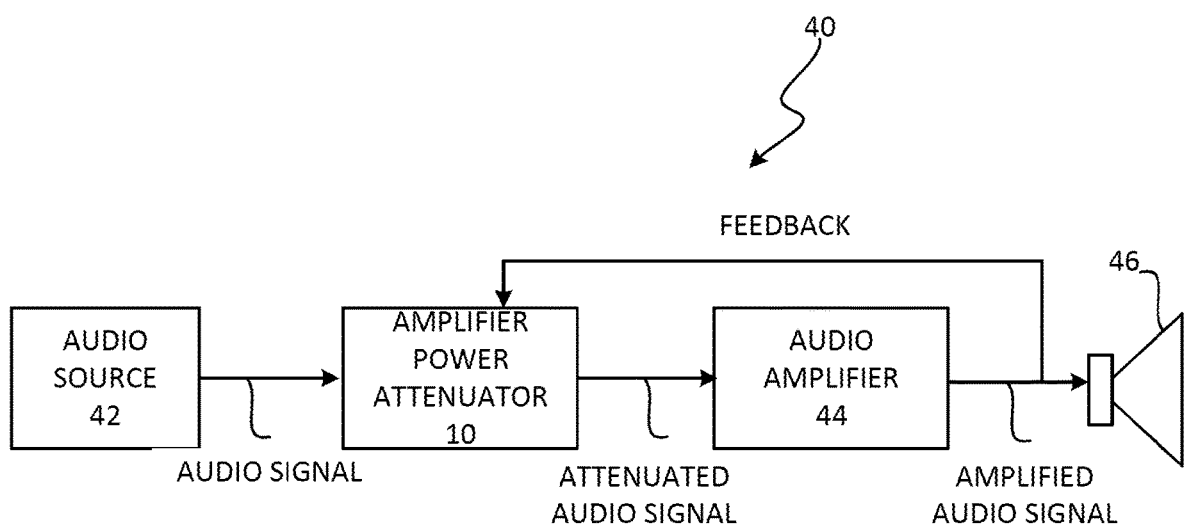
FIG. 4 is a block diagram of a closed loop amplifier power limiting system utilizing the amplifier power attenuator.

With reference to FIG. 4, the amplifier power attenuator 10 is preferably implemented as an independent component of an audio system 40 that also includes at least the components of an audio source 42, an audio amplifier 44, and a loudspeaker 46. The components are arranged in a closed-loop configuration, wherein the audio signal output from audio source 42 is supplied as an input (e.g., Input B of FIG. 2) to the amplifier power attenuator 10, an attenuated audio signal is output (e.g., Output A of FIG. 2) from the amplifier power attenuator 10 and supplied as an input to the audio amplifier 44. Further, the amplified audio signal is output from the audio amplifier 44 and supplied as both an input to the loudspeaker 46 and as an amplified audio feedback signal input (e.g., Input A of FIG. 2) to the amplifier power attenuator 10.

J. Operation of Preferred Embodiment.

a. Basic Operation of Preferred Embodiment.

Figure 5:
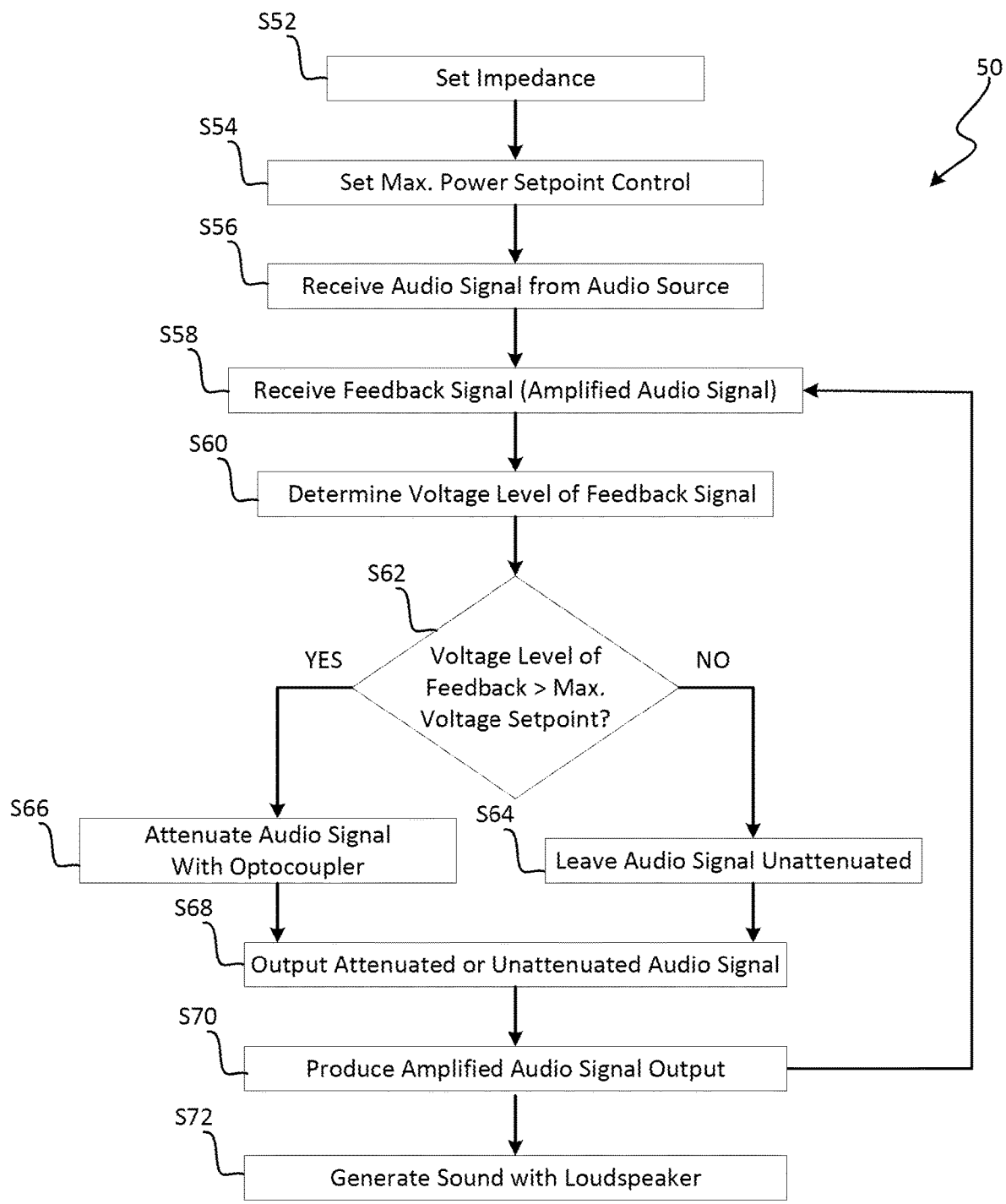
FIG. 5 is a flowchart illustrating basic operation of the closed loop amplifier power limiting system utilizing the amplifier power attenuator.

A basic method 50 of operating the amplifier power attenuator 10 within the context of the closed loop audio system 40 can be appreciated with reference to the flowchart of FIG. 5. As shown, the method 50 includes receiving a user-set impedance setting, S52, and receiving a user-set maximum power set-point, S54, at the amplifier power attenuator 10, from which a maximum voltage set-point can be calculated. The method 50 further includes receiving the audio signal (e.g., Input B of FIG. 2) from the audio source 42, S56, and receiving the amplified audio feedback signal (e.g., Input A of FIG. 2) from the audio amplifier 44, S58. The method further includes determining the voltage level of the amplified audio feedback signal, S60, and determining whether the voltage level of the amplified audio feedback signal is greater than the maximum voltage set-point, S62. The amplifier power attenuator 10 determines the voltage level of the amplified audio feedback signal by measuring the amplitude of the amplified audio signal in volts.

If the voltage level of the amplified audio feedback signal is not greater than (or equal to) the maximum voltage set-point, S62:NO, the audio signal from the audio source 42 is left unattenuated, S64. If the voltage level of the amplified audio feedback signal is greater than the maximum voltage set-point, S62:YES, the audio signal from the audio source 42 is attenuated through use of the variable impedance optocoupler, S66, with the goal of reducing the voltage level of a subsequent amplified audio feedback signal (e.g., Input A of FIG. 2) from the audio amplifier 44 to a level that is less than or equal to the maximum voltage set-point. The attenuated or unattenuated audio signal of the amplifier power attenuator 10 is then output, S68, and amplified by the audio amplifier 44 to produce an amplified audio signal output, S70. The amplified audio signal output from the audio amplifier 44 is supplied as the amplified audio feedback signal to the amplifier power attenuator 10, S58, and as input to the loudspeaker 46 from which sound is generated, S72.

The amplifier power attenuator 10 attenuates the audio signal (e.g., Input B) from the audio source 42 by reducing the voltage of the audio signal to a magnitude that is at or below a maximum voltage set-point, V. The maximum voltage set-point can be calculated from the user defined power set-point and the user defined impedance setting, e.g., $P=V^2/R$, where P is the user defined power set-point and R is the user defined impedance setting.

The voltage of the audio signal from the audio source 42 can be reduced by presenting a reduced impedance via the variable impedance optocoupler 20 acting as a potentiometer between original input signal Vin (Input B of FIG. 2) and ground. The amount of impedance presented by the variable impedance optocoupler 20 is controlled by the current supplied to the LED of the variable impedance optocoupler 20 by the microcontroller 12 based on the maximum voltage set-point (e.g., the greater the current, the greater the decrease in impedance of the variable impedance optocoupler 20, and resultantly, the greater the attenuation (or the greater the reduction in output voltage)). The reduced voltage audio signal is output from the amplifier power attenuator 10 as the attenuated audio signal.

In a preferred embodiment, the variable impedance optocoupler 20 is connected between the incoming audio signal and the signal ground. The incoming audio signal first goes through a fixed impedance that is in series with the variable impedance optocoupler 20. The attenuated audio signal output from the amplifier power attenuator 10 comes from a "center tap" of the fixed impedance and the variable impedance optocoupler 20, which together form a variable "resistor divider." Notably, the impedance of the variable impedance optocoupler 20 decreases as the LED current increases. As such, the lower the impedance of the variable impedance optocoupler 20, the more attenuation realized on the output of the amplifier power attenuator 10.

The method 50 prevents overpowering of the loudspeaker 42 (and/or other audio equipment that may receive an output from the audio amplifier 44), thereby preventing possible damage to the loudspeaker 46. Further, the method 50 reduces or eliminates clipping distortion generated by the audio amplifier 44 by effectively lowering the gain of the audio system 40 by attenuating the incoming audio signal (e.g., Input B) from the audio source 42. A closed loop is formed around the audio amplifier 44, from input to output, through user of the amplifier power attenuator 10.

b. Enhanced Operation of Preferred Embodiment.

Figure 6:
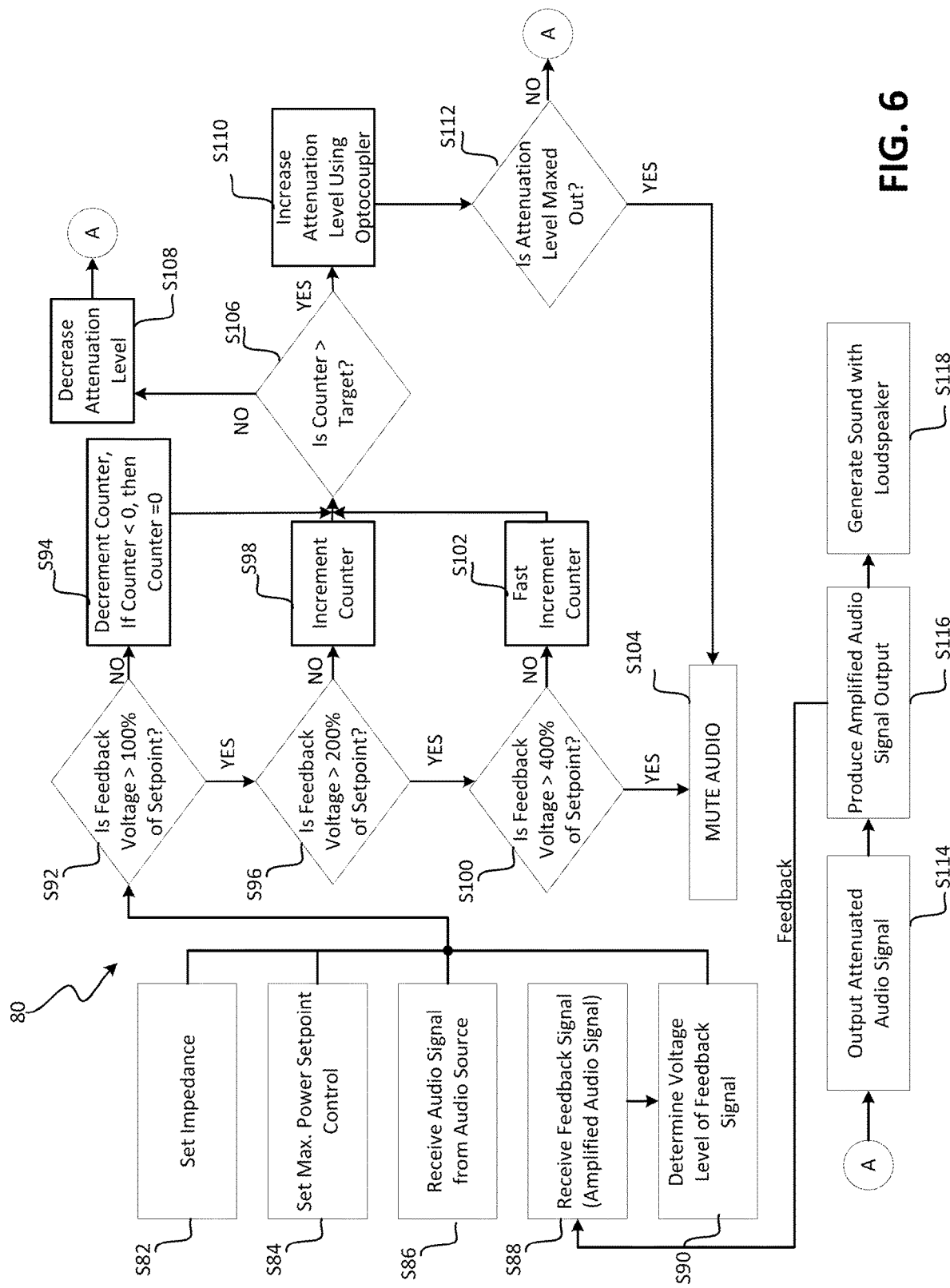
FIG. 6 is a flowchart illustrating enhanced operation of the closed loop amplifier power limiting system utilizing the amplifier power attenuator.

An enhanced method 80 of operating the amplifier power attenuator 10 within the context of the closed loop audio system 40 can be appreciated with reference to the flowchart of FIG. 6. The enhanced method 80 makes use of a programmed counter as well as a plurality of predefined attenuation levels.

As shown, the method 80 includes receiving at the amplifier power attenuator 10 a user-set impedance setting, S82, and receiving a user-set maximum power set-point, S84, from which a maximum voltage set-point can be calculated. The method 80 further includes receiving the audio signal (e.g., Input B of FIG. 2) from the audio source 42, S86, receiving the amplified audio feedback signal (e.g., Input A of FIG. 2) from the audio amplifier 44, S88, and determining the voltage level of the amplified audio feedback signal, S90, at the amplifier power attenuator 10. The amplifier power attenuator 10 determines the voltage level of the amplified audio feedback signal by measuring the amplitude of the amplified audio signal in volts.

The method 80 continues with determining whether the voltage level of the amplified audio feedback signal is greater than 100% of the maximum voltage set-point, S92. If the voltage level of the amplified audio feedback signal is not greater than 100% of the maximum voltage set-point, S92:NO, the counter is decremented, for example by one, (and set to zero if the counter is less than zero), S94. If the voltage level of the amplified audio feedback signal is greater than 100% of the maximum voltage set-point, S92:YES, it is determined whether the voltage level of the amplified audio feedback signal is greater than 200% of the maximum voltage set-point, S96 (e.g., grossly exceeding the maximum voltage set-point).

If it is determined that the voltage level of the amplified audio feedback signal is not greater than 200% of the maximum voltage set-point, S96:NO, the counter is standard incremented, for example by five, (e.g., a linear incrementation wherein each standard incrementation is by the same value as the previous standard incrementation), S98. If it is determined that the voltage level of the amplified audio feedback signal is greater than 200% of the maximum voltage set-point, S96:YES, it is determined whether the voltage level of the amplified audio feedback signal is greater than 400% of the maximum voltage set-point, S100 (e.g., extremely exceeding the user-set maximum voltage set-point).

If it is determined that the voltage level of the amplified audio feedback signal is not greater than 400% of the maximum voltage set-point, S100:NO, the counter is fast incremented, S102 (e.g., a non-linear single incrementation to one of plurality of values that will activate a predetermined level of attenuation). Notably, the ability to increment the counter corresponding to the magnitude of error in the amplified audio feedback signal (e.g., magnitude of error=the percentage of which the voltage of the amplified audio feedback signal is greater than the maximum voltage set-point) enables a real-time, dynamic response to the error (e.g., the greater error, the greater the increment, and the greater the attenuation that can be applied to the audio feedback signal).

If it is determined that the voltage level of the amplified audio feedback signal is greater than 400% of the maximum voltage set-point, S100:YES, audio within the system audio system 40 is muted (e.g., the power level of the attenuated audio signal output from the amplifier power attenuator 10 is reduced to zero (or at least −20 dB)), S104.

Subsequent to each of steps S94, S98, and S102, and dependent upon which of S94, S98, and S102 is activated, the counter value is assessed against a plurality of predetermined target values, S106, each of which is associated with a predetermined attenuation level. If the counter value is not greater than one of the plurality of predetermined target values, S106:NO, the attenuation level of the attenuated audio signal output from the amplifier power attenuator 10 is decreased, S108 (e.g., the voltage level of the attenuated audio signal output from the amplifier power attenuator 10 is increased by increasing the impedance presented by the variable impedance optocoupler 20 resulting in decreased attenuation, a.k.a., gain) and the attenuated audio signal is output from the amplifier power attenuator 10, S114, and supplied to the audio amplifier 44 to produce an amplified audio signal output, S116. The amplified audio signal output is supplied to the loudspeaker from which sound is generated, S118, and is also supplied as the amplified audio feedback signal to the amplifier power attenuator 10, S88, to repeat the cycle of comparing the voltage level of the amplified audio feedback signal to the maximum voltage set-point.

If the counter value is greater than one of the plurality of predetermined target values, S106:NO, the attenuation level of the attenuated audio signal output from the amplifier power attenuator 10 is increased at a level corresponding to the target value of which the counter is greater, S110, (e.g., the voltage level of the attenuated audio signal output from the amplifier power attenuator 10 is reduced by reducing the impedance presented by the variable impedance optocoupler). For example:

If counter<target value of 100, do nothing;
Else if target value of 100<counter<target value of 200, attenuate by 1 dB
Else if target value of 200<counter<target value of 300, attenuate by 2 dB
Else if target value of 300<counter<target value of 400, attenuate by 3 dB
... and so on up to a predetermined maximum attenuation level (e.g., 15 dB)

Continuing with the method 80, subsequent to increasing the attenuation level, S110, it is determined whether the attenuation level is maxed out (e.g., the predetermined maximum attenuation level has been reached). If the attenuation level is maxed out, S:110:YES, the audio within the audio system 40 is muted (e.g., the power level of the attenuated audio signal output from the amplifier power attenuator 10 is reduced to zero (or at least −20 dB)), S104. If the attenuation level is not maxed out, S:110:NO, the attenuated audio signal is output from the amplifier power attenuator 10, S114, and supplied to the audio amplifier 44 to produce an amplified audio signal output, S116. The amplified audio signal output is supplied to the loudspeaker from which sound is generated, S118, and is also supplied as the amplified audio feedback signal to the amplifier power attenuator 10, S88, to repeat the cycle of comparing the voltage level of the amplified audio feedback signal to the maximum voltage set-point.

In view of FIG. 6 and its description herein, consider the following example for a clearer understanding of the operation of the audio system 40. Presume that the amplified audio feedback signal is determined to have a voltage level greater than the maximum voltage set-point, which indicates an error in the amplified audio feedback signal. In the view of the error, the counter, which is representative of the error, will start incrementing. If the counter increments up to, for example, a target level of 300 during some very loud transients, the attenuation level applied would be somewhere around 3 dB (see target levels and corresponding attenuation levels in example above). Once this attenuation is applied at a level where the number of errors from a reading of the returning amplified audio feedback signal that increments the counter is roughly equal to the number of readings of the returning amplified audio feedback signal where there was no error, e.g., the counter was decremented, the counter will have reached an equilibrium and the amount of attenuation applied by the amplifier power attenuator 10 is sufficient to avoid excessive output from the audio amplifier 44 thereby providing a delay and decay in the attenuation to make the change in attenuation essentially, audibly seamless.

If, and when, the amplified audio feedback signal is at "quieter" passage and attenuation is no longer needed, reading of the amplified audio feedback signal will produce few errors and the counter will decrement on each reading of the amplified audio feedback signal. As this happens, the attenuation will gradually decrease as the counter falls into the next target level with an associated decreased attenuation level until, eventually, the counter is less than 100 and no attenuation is applied.

As with the method 50, the method 80 prevents overpowering of the loudspeaker 42 (and/or other audio equipment that may receive an output from the audio amplifier 44), thereby preventing possible damage to the loudspeaker 46. Further, the method 80 reduces or eliminates clipping distortion generated by the audio amplifier 44 by lowering the gain of the audio system 40 by attenuating the incoming audio signal (e.g., Input B) from the audio source 42. A closed loop is formed around the audio amplifier 44, from input to output, through user of the amplifier power attenuator 10.

Unless otherwise defined, all technical and scientific terms used herein have the same meaning as commonly understood by one of ordinary skill in the art to which this invention belongs. Although methods and materials similar to or equivalent to those described herein can be used in the practice or testing of the various embodiments of the present disclosure, suitable methods and materials are described above. All patent applications, patents, and printed publications cited herein are incorporated herein by reference in their entireties, except for any definitions, subject matter disclaimers or disavowals, and except to the extent that the incorporated material is inconsistent with the express disclosure herein, in which case the language in this disclosure controls. The various embodiments of the present disclosure may be embodied in other specific forms without departing from the spirit or essential attributes thereof, and it is therefore desired that the various embodiments of the present disclosure be considered in all respects as illustrative and not restrictive. Any headings utilized within the description are for convenience only and have no legal or limiting effect.

What is claimed is:

1. An amplifier power attenuator, comprising:
   a microcontroller that receives an amplified audio feedback signal from an audio amplifier driving a loudspeaker;
   a variable impedance optocoupler in communication with the microcontroller, wherein the variable impedance optocoupler receives an audio signal from an audio source;
   an impedance selector in communication with the microcontroller, wherein the impedance selector defines an impedance of the loudspeaker; and
   a maximum power set-point control in communication with the microcontroller, wherein maximum power set-point control defines a maximum power set-point of the loudspeaker,
   wherein the microcontroller controls the variable impedance optocoupler to attenuate the audio signal and output an attenuated audio signal to the audio amplifier, and
   wherein the microcontroller attenuates the audio signal based on: the amplified audio feedback signal, the impedance, and the maximum power set-point.

2. The amplifier power attenuator of claim 1, wherein the impedance is a user-set impedance.

3. The amplifier power attenuator of claim 1, wherein the maximum power set-point is a user-set maximum power set-point.

4. The amplifier power attenuator of claim 1, further comprising an independent structural housing within which at least the microcontroller and the variable impedance optocoupler are housed.

5. The amplifier power attenuator of claim 4, wherein the independent structural housing includes an audio input interface through which the audio signal is supplied to the microcontroller, an amplified audio feedback input interface through which the amplified audio feedback signal is supplied to the microcontroller, and an attenuated audio signal output interface through which the amplified audio feedback signal is output.

6. The amplifier power attenuator of claim 4, wherein the independent structural housing includes a display in communication with the microcontroller.

7. The amplifier power attenuator of claim 4, further comprising a power supply powering the microcontroller, wherein the power supply is internal to the independent structural housing.

8. The amplifier power attenuator of claim 4, further comprising a power supply powering the microcontroller, wherein the power supply is external to the independent structural housing.

9. The amplifier power attenuator of claim 4, further comprising a wireless communication interface and, wherein at least one of the impedance selector and the maximum power set-point control are external to the independent structural housing and wirelessly communicates the respective impedance and maximum power set-point to the microcontroller via the wireless communication interface.

10. The amplifier power attenuator of claim 1, further comprising an A/D converter that converts the amplified audio feedback signal from an analog signal to a digital signal that is supplied to the microcontroller.

11. The amplifier power attenuator of claim 1, wherein the microcontroller controls the variable impedance optocoupler to attenuate the audio signal to one of a plurality of predetermined attenuation levels.

12. The amplifier power attenuator of claim 11, wherein attenuating the audio signal to one of plurality of predetermined attenuation levels is based on an error in the amplified audio feedback signal, wherein the error is representative of a difference between a voltage level of the amplified audio feedback signal and a maximum voltage set-point as determined from the impedance of the loudspeaker and the maximum power set-point.

13. The amplifier power attenuator of claim 12, wherein the error in the amplified audio feedback signal is reflected in a counter value that is compared to a plurality of target values associated with respective predetermined attenuation levels from the plurality of predetermined attenuation levels.

14. The amplifier power attenuator of claim 13, wherein a relationship between the error in the amplified audio feedback signal and the counter value is either linear or non-linear dependent upon a magnitude of the error.

15. A method of using the amplifier power attenuator of claim 1, comprising:
   (a) determining a maximum voltage set-point based on the impedance of the loudspeaker and the maximum power setpoint;
   (b) determining a voltage level of the amplified audio feedback signal;
   (c) determining that the voltage level of the amplified audio feedback signal is greater than the maximum voltage set-point;
   (d) responsive to determining that the voltage level of the amplified audio feedback signal is greater than the maximum voltage set-point, controlling the variable impedance optocoupler to present a decreased impedance to the audio signal to reduce the voltage level of the audio signal resulting in an attenuated audio signal;
   (e) supplying the attenuated audio signal to the audio amplifier; and
   (f) repeating steps (a)-(f).

16. A method for attenuating an audio signal supplied to an audio amplifier that is driving a loudspeaker, comprising:
   (a) receiving an impedance setting of the loudspeaker;
   (b) receiving a maximum power set-point of the loudspeaker;
   (c) determining a maximum voltage set-point based on the impedance setting and the maximum power set-point;
   (d) receiving an audio signal input from an audio source;
   (e) receiving an amplified audio feedback signal representative of an output of the audio amplifier;
   (f) determining a voltage level of the amplified audio feedback signal;
   (g) determining that the voltage level of the amplified audio feedback signal is greater than the maximum voltage set-point;
   (h) responsive to determining that the voltage level of the amplified audio feedback signal is greater than the maximum voltage set-point, controlling a variable impedance optocoupler to present a decreased impedance to the audio signal to reduce the voltage level of the audio signal resulting in an attenuated audio signal;
   (i) supplying the attenuated audio signal to the audio amplifier; and
   (j) repeating steps (d)-(j).

17. The method of claim 16, wherein controlling the variable impedance optocoupler includes controlling the variable impedance optocoupler to present one of a plurality of predetermined impedances to ground on the audio signal input, wherein each of the plurality of predetermined impedances corresponds to a different one of a plurality of predetermined attenuation levels.

18. The method of claim 17, wherein attenuating the audio signal to one of a plurality of predetermined attenuation levels is based on an error in the amplified audio feedback signal, wherein the error is representative of a difference between a voltage level of the amplified audio feedback signal and the maximum voltage set-point.

19. The method of claim 18, wherein the error in the amplified audio feedback signal is reflected in a counter value that is compared to a plurality of target values associated with respective predetermined attenuation levels from the plurality of predetermined attenuation levels.

20. The method of claim 19, wherein a relationship between the error in the amplified audio feedback signal and the counter is either linear or non-linear dependent upon a magnitude of the error.

\* \* \* \* \*